(12) United States Patent
Park et al.

(10) Patent No.: US 9,954,510 B2
(45) Date of Patent: Apr. 24, 2018

(54) COMMON MODE FILTER

(71) Applicant: SAMSUNG ELECTRO-MECHANICS CO., LTD., Suwon-Si, Gyeonggi-Do (KR)

(72) Inventors: Seung Wook Park, Suwon-Si (KR); Won Chul Sim, Suwon-Si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 173 days.

(21) Appl. No.: 14/952,478

(22) Filed: Nov. 25, 2015

(65) Prior Publication Data
US 2016/0156326 A1 Jun. 2, 2016

(30) Foreign Application Priority Data

Nov. 28, 2014 (KR) .................. 10-2014-0168749
Nov. 9, 2015 (KR) .................. 10-2015-0156709

(51) Int. Cl.
*H03H 7/01* (2006.01)
*H03H 7/42* (2006.01)
*H01F 27/28* (2006.01)
*H03H 1/00* (2006.01)

(52) U.S. Cl.
CPC ......... *H03H 7/427* (2013.01); *H01F 27/2823* (2013.01); *H03H 2001/0085* (2013.01)

(58) Field of Classification Search
CPC ............ H03H 7/427; H03H 2001/0085; H01F 27/2823
USPC .......................................... 333/185; 336/200
See application file for complete search history.

(56) References Cited

U.S. PATENT DOCUMENTS

| 6,181,232 | B1 | 1/2001 | Kitamura | |
| 6,417,461 | B1* | 7/2002 | Hirahara | .................. H01G 4/40 |
| | | | | 174/201 |
| 7,091,816 | B1 | 8/2006 | Ito et al. | |
| 7,167,071 | B2* | 1/2007 | Takaya | ................ H01F 17/0013 |
| | | | | 29/602.1 |
| 2004/0045635 | A1* | 3/2004 | Bandyopadhyay | ... B29C 39/003 |
| | | | | 148/104 |

(Continued)

FOREIGN PATENT DOCUMENTS

| CN | 1207565 A | 2/1999 |
| CN | 1835132 A | 9/2006 |

(Continued)

OTHER PUBLICATIONS

Chinese Office Action dated Mar. 27, 2017, issued in Chinese Patent Application No. 201510855285.1. (w/ English translation).

(Continued)

*Primary Examiner* — Robert J Pascal
*Assistant Examiner* — Rakesh Patel
(74) *Attorney, Agent, or Firm* — McDermott Will & Emery LLP

(57) ABSTRACT

A common mode filter includes a coil part in which a plurality of insulating layers having coils formed on one surfaces thereof and containing fillers are stacked; a first cover part disposed beneath the coil part; and a second cover part disposed on the coil part, wherein surface reforming layers improving close adhesion between the insulating layers are formed on at least one surfaces of the insulating layers.

9 Claims, 15 Drawing Sheets

(56) References Cited

U.S. PATENT DOCUMENTS

| | | | |
|---|---|---|---|
| 2005/0030144 A1* | 2/2005 | Yoshida | H01F 17/0006 336/200 |
| 2010/0259352 A1* | 10/2010 | Yan | H01F 5/003 336/200 |
| 2011/0002075 A1 | 1/2011 | Asakawa et al. | |
| 2011/0007438 A1* | 1/2011 | Ito | H01F 17/0006 361/56 |
| 2011/0285477 A1* | 11/2011 | Nakagawa | H03H 7/09 333/185 |
| 2012/0300355 A1 | 11/2012 | Umeda et al. | |

FOREIGN PATENT DOCUMENTS

| | | |
|---|---|---|
| CN | 102802333 A | 11/2012 |
| CN | 103606448 A | 2/2014 |
| EP | 0435230 A2 | 7/1991 |
| JP | 2006-210541 A | 8/2006 |
| JP | 2006-286934 A | 10/2006 |
| JP | 2007-067214 A | 3/2007 |
| JP | 2013-161939 A | 8/2013 |
| KR | 10-2013-0047572 A | 5/2013 |

OTHER PUBLICATIONS

Korean Office Action dated Oct. 26, 2016, issued in Korean patent application No. 10-2015-0156709. (w/ English translation).

* cited by examiner

COMMON MODE FILTER

CROSS-REFERENCE TO RELATED APPLICATION

This application claims the priority and benefit of Korean Patent Application Nos. 10-2014-0168749 filed on Nov. 28, 2014 and 10-2015-0156709 filed on Nov. 9, 2015 with the Korean Intellectual Property Office, the disclosure of which is incorporated herein by reference.

BACKGROUND

The present disclosure relates to a common mode filter.

In accordance with the advancement of technology, electronic devices such as mobile phones, home appliances, personal computers (PCs), personal digital assistants (PDAs), liquid crystal display (LCDs), and the like, have been changed from an analog scheme to a digital scheme, and the speed of electronic devices has increased due to an increase in an amount of processed data. Therefore, a universal serial bus (USB) 2.0, a USB 3.0, and a high-definition multimedia interface (HDMI) have widely spread as high-speed signal transmitting interfaces, and have been used in many digital devices such as personal computers and digital high-definition televisions.

These high speed interfaces adopt a differential signal system which transmits differential signals (differential mode signals) using a pair of signal lines, unlike a single-end transmitting system that has generally been used for a long period of time. However, electronic devices that are digitized and have increased speeds are sensitive to external stimuli, and thus signal distortion due to high frequency noise is often generated.

Causes of this abnormal voltage and noise include switching voltage generated in a circuit, power noise included in a power supply voltage, an unnecessary electromagnetic signal or electromagnetic noise, and the like, and a common mode filter (CMF) has been used as a unit for preventing the above-mentioned abnormal voltage and high frequency noise from being introduced into a circuit.

A common mode filter according to the related art may mainly be divided into a multilayer common mode filter and a thin film type common mode filter.

In a case of the multilayer common mode filter, coil layers are formed on ceramic sheets, and the ceramic sheets on which the coil layers are formed are stacked, compressed, and sintered, and thus close adhesion between the coil layers may be secured. However, in the multilayer common mode filter, since a conductive paste is used in a process of forming the coils, precision of a coil pattern is low, and resistance of the coil pattern is high.

In a case of the thin film type common mode filter, since respective layers are formed using a method such as coating, or the like, after a polymer resin is hardened, close adhesion between the layers is low. A method of enhancing bonding through a silane coating has been used in order to increase close adhesion of the thin film described above. However, close adhesion, or the like, is lower in the thin film type common mode filter than in the multilayer common mode filter. Therefore, a method that may increase the close adhesion has been required.

In addition, in the thin film type common mode filter, in a case of forming the common mode filter by bonding a magnetic layer to a ferrite substrate on which the coil is formed, an entire thickness of the common mode filter is reduced, and thus a handling problem occurs in a process of manufacturing the common mode filter, whereby yield is reduced due to defects such as generation of cracks, or the like, when the thickness of the common mode filter is reduced.

Therefore, a common mode filter that may satisfy low costs and superior electrical features, and a method of manufacturing the same, has been required.

SUMMARY

An aspect of the present disclosure may provide a common mode filter in which adhesion between coil layers may be improved.

An aspect of the present disclosure may also provide a common mode filter capable of satisfying low cost and superior electrical features, and a method of manufacturing the same.

An aspect of the present disclosure may also provide a common mode filter capable of being protected from static electricity.

According to an aspect of the present disclosure, a common mode filter may include: a coil part in which a plurality of insulating layers having coils formed on one surfaces thereof and containing fillers are stacked; a first cover part disposed beneath the coil part; and a second cover part disposed on the coil part, wherein surface reforming layers improving close adhesion between the insulating layers are formed on at least one surfaces of the insulating layers.

According to another aspect of the present disclosure, a common mode filter may include: a coil part in which a plurality of insulating layers having coils formed on one surfaces thereof and containing fillers are stacked; a first cover part disposed beneath the coil part; and a second cover part disposed on the coil part, wherein the first and second cover parts contain a magnetic resin composite containing magnetic particles.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
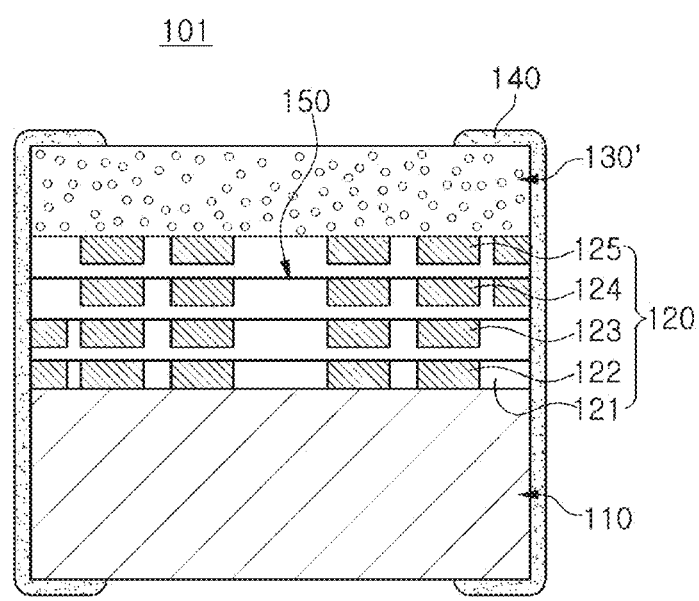
FIG. 1 is a schematic cross-sectional view of a common mode filter according to a first exemplary embodiment in the present disclosure.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Figure 2:
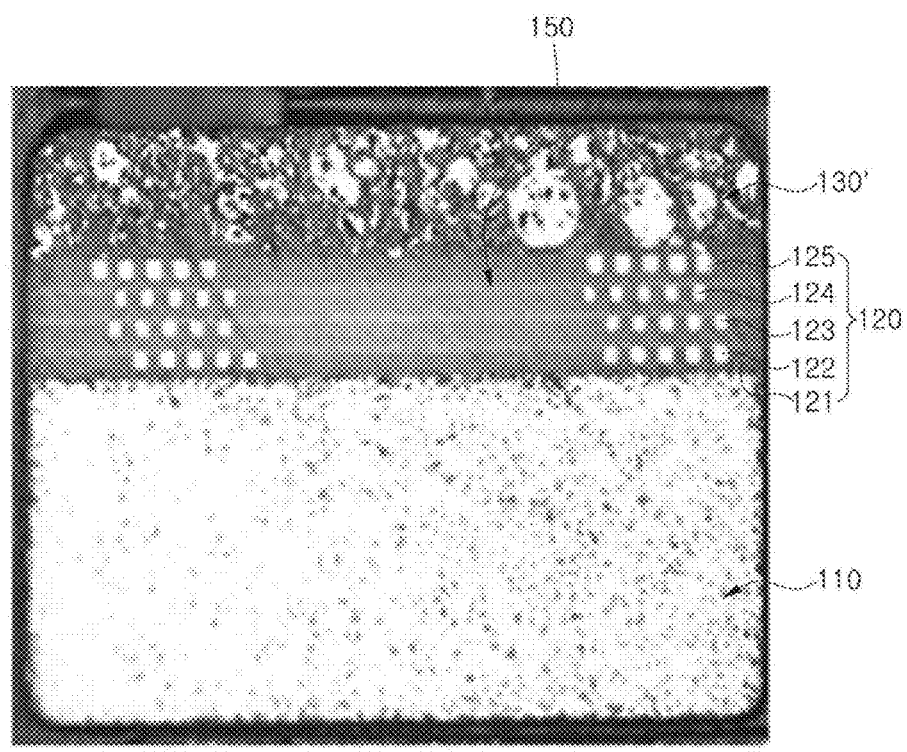
FIG. 2 is a cross section photograph of the common mode filter according to a first exemplary embodiment in the present disclosure.

FIG. 1 is a schematic cross-sectional view of a common mode filter 101 according to a first exemplary embodiment; FIG. 2 is a cross section photograph of the common mode filter according to an exemplary embodiment photographed by a vertical scanning electron microscope (V-SEM).

Referring to FIGS. 1 and 2, the common mode filter 101 according to the first exemplary embodiment may include a first cover part 110, a second cover part 130' and a coil part 120.

The first cover part 110 may contain a magnetic ceramic material, and may include, for example, a ferrite substrate. In a case in which the first cover part includes the ferrite substrate, the ferrite substrate may have a magnetic permeability of 300 or more.

The coil part 120 may be disposed on the first cover part 110.

The coil part 120 may include a plurality of insulating layers 121, coils 122 to 125, and surface reforming layers 150.

The coils 122 to 125 may be disposed in a spiral shape, and may be formed of a conductive material. For example, the coils 122 to 125 may be formed on the insulating layers 121 by a screen printing or lithography process.

One end portions of first to fourth coils 122 to 125 may be exposed to aside surface of the coil part 120 to thereby be electrically connected to an external electrode 140 to be described below.

The first and third coils 122 and 124 may be electrically connected to each other by conductive vias (not illustrated) of the insulating layers 121, and the second and fourth coils 123 and 125 may also be electrically connected to each other by conductive vias (not illustrated) of the insulating layers 121.

The conductive vias may be formed by forming via holes in the insulating layers 121 by a laser punching or mechanical punching method and filling the via holes with a conductive material.

The insulating layers 121 may be configured in a stack form using build-up films of Ajinomoto build-up films (ABF), polyimide, epoxy, benzocyclobutene (BCB), or the like. The build-up films may contain fillers in order to enhance a physical feature or a magnetic feature of the build-up film.

In order to form the coil part 120 as described above, a process of forming the coils 122 to 125 on each of the plurality of insulating layers 121 and then stacking and compressing the plurality of insulating layers 121 on which the coils 122 to 125 are formed may be performed. However, the fillers contained in the insulating layers 121 may cause a reduction in adhesion between the respective insulating layers 121 in a process of bonding the respective insulating layers 121 to each other.

Figure 3:
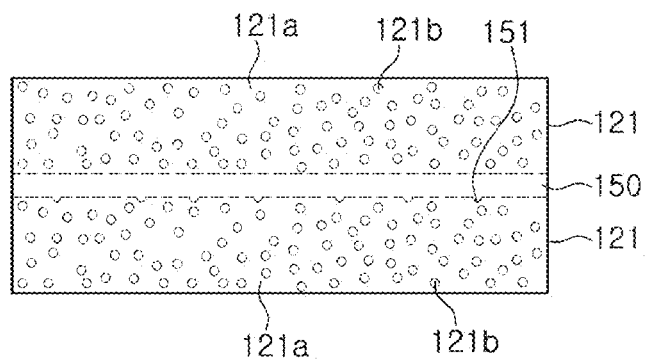
FIG. 3 is a schematic cross-sectional view illustrating a surface reforming layer disposed between insulating layers.

FIG. 3 is an enlarged cross-sectional view of adjacent insulating layers 121.

Referring to FIGS. 1 through 3, the surface reforming layers 150 may be disposed between the insulating layers 121.

The insulating layer 121 may contain a resin 121a and fillers 121b. The fillers 121b contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

That is, the surface reforming layer 150 is defined as a region of the coil part 120 that contains a smaller amount of fillers than that of other portions, or does not contain the fillers.

The surface reforming layers 150 may be formed by performing chemical surface treatment (for example, a desmear process) to remove fillers 121b exposed to surfaces of the insulating layers 121, before the respective insulating layers 121 are stacked as described below.

When the fillers 121b are removed as described above, the surface reforming layer 150 may not contain the fillers or may contain at least a smaller amount of fillers than that of the insulating layer 121.

In addition, portions in which the fillers are removed in the surface reforming layer 150 may have a groove shape. The portions in which the fillers are removed as described above may serve as anchors 151.

Therefore, some of the materials configuring the insulating layers 121 may be accommodated in the anchors 151 in a process of stacking and compressing the insulating layers 121, and thus adhesion between the insulating layers 121 may be further improved.

The surface reforming layer 150 may be formed at a thickness of 1 μm or more for the purpose of a substantial effect of improvement of the adhesion, and more preferably, at a thickness of 1.5 μm to 0.3 μm. In a case in which a thickness of the surface reforming layer 150 exceeds 3.0 μm, a region in which a content of fillers is low or the fillers are not contained in the coil part 120 may be increased, and thus performance of the common mode filter may be deteriorated, and in a case in which a thickness of the surface reforming layer 150 is less than 1.5 μm, an adhesion improving effect between the insulating layers 121 may be low.

The second cover part 130' may be disposed on the coil part 120. The second cover part 130' may contain a magnetic material, such as a magnetic resin composite. The magnetic resin composite means a composite manufactured by dispersing magnetic particles in a polymer resin, and a magnetic material such as ferrite, pure iron, or the like, may be used as a magnetic material of the magnetic resin composite.

In a case in which the second cover part 130' contains the magnetic resin composite, magnetic permeability of the second cover part may be adjusted depending on a content of the magnetic material included in the magnetic resin composite.

Hereinafter, common mode filters according to various exemplary embodiments will be described with reference to FIGS. 4 through 8. In describing common mode filters according to various exemplary embodiments, a description for the same components or contents will be omitted.

Figure 4:
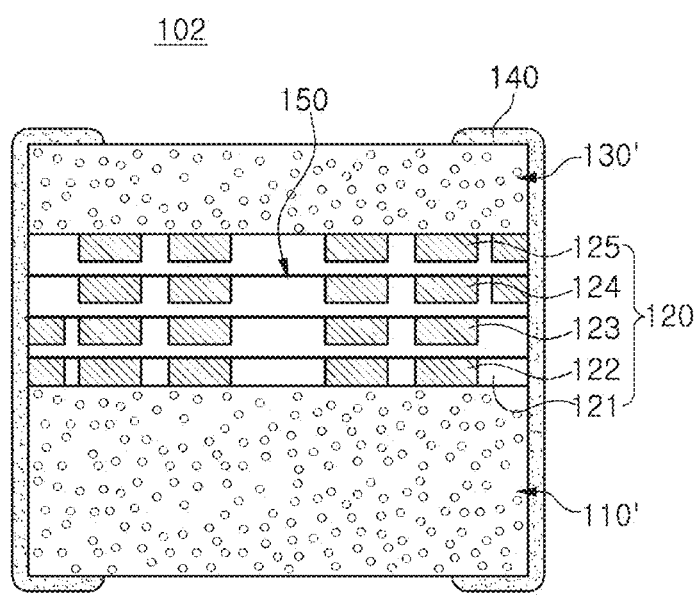
FIGS. 4 through 8 are schematic cross-sectional views of common mode filters according to various exemplary embodiments in the present disclosure.

FIG. 4 is a schematic cross-sectional view of a common mode filter 102 according to a second exemplary embodiment.

Referring to FIG. 4, the common mode filter 102 according to the second exemplary embodiment may include a first cover part 110', a second cover part 130' and a coil part 120.

The first cover part 110' may contain a magnetic resin composite unlike the first cover part according to the first exemplary embodiment including the ferrite substrate. Since the ferrite substrate used as the first cover part 110' is a ceramic sintered body, cracks may be generated in the ferrite substrate in a process of manufacturing or using the ferrite substrate. However, when the first cover part 110' is formed using the magnetic resin composite, flexibility may be provided to the first cover part 110', and thus generation of cracks may be reduced.

TABLE 1

|  | Ref. (Ferrite Substrate μ = 300, Magnetic Resin Composite μ = 12) | Magnetic Resin Composite (μ = 12) | Magnetic Resin Composite (μ = 20) | Magnetic Resin Composite (μ = 30) | Magnetic Resin Composite (μ = 40) |
| --- | --- | --- | --- | --- | --- |
| CM Impedance @ 100 MHz | 86.6Ω | 80.5Ω | 86.1Ω | 89.5Ω | 91.3Ω |
| CM Attenuation | −35.7 dB @ 0.76 GHz | −34.4 dB @ 0.83 GHz | −36.3 dB @ 0.81 GHz | −37.6 dB @ 0.80 GHz | −38.5 dB @ 0.78 GHz |

However, the magnetic resin composite has a problem in that magnetic permeability is lower than the magnetic permeability (about 300) of the ferrite substrate. Therefore, there is a loss in terms of impedance and attenuation.

However, as seen in Table 1, in a case in which the magnetic permeability of the magnetic resin composite of 20 or more is secured, impedance and attenuation characteristics similar to those in a case in which the first cover part 110' is formed of the ferrite substrate may be secured.

The magnetic resin composite may be formed by dispersing magnetic particles in a polymer resin, and the magnetic permeability of the magnetic resin composite may be increased by increasing a ratio of the magnetic particles.

The magnetic particles may be formed using a magnetic material such as ferrite, pure iron, or the like.

The coil part 120 may be disposed on the first cover part 110'.

The coil part 120 may include a plurality of insulating layers 121, coils 122 to 125, and surface reforming layers 150.

The insulating layer 121 may contain a resin 121a and fillers 121b. The fillers 121b contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

Figure 5:
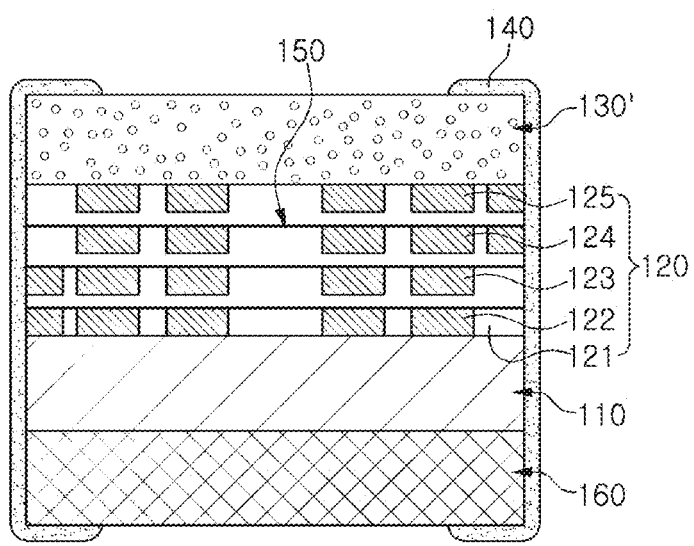

FIG. 5 is a schematic cross-sectional view of a common mode filter 103 according to a third exemplary embodiment.

The common mode filter 103 according to the third exemplary embodiment may further include an electrostatic discharge (ESD) preventing part 160 disposed beneath the first cover part 110.

The ESD preventing part 160 may include a thermistor disposed beneath the first cover part 110 formed of the ferrite substrate to allow the common mode filter 103 according to the present exemplary embodiment to serve as an ESD protecting element.

The ESD preventing part 160 may be formed by forming two ESD electrodes (not illustrated) to be spaced apart from each other and providing an ESD material in a space between the ESD electrodes spaced apart from each other. As the ESD material, a material obtained by dispersing conductive metals such as Cu, Ag, or the like, in an insulating inorganic material such as $Al_2O_3$, $TiO_2$, Zn, or the like, or an insulating organic material may be used. In addition, materials that are operated as a non-conductor at ordinary times and conduct electricity through conductive metals when an over-voltage such as static electricity is applied thereto may be used as the ESD material.

The common mode filter 103 according to the present exemplary embodiment may further include external electrodes (not illustrated) electrically connected to the ESD electrodes in the ESD preventing part 160.

The coil part 120 may be disposed on the first cover part 110.

The coil part 120 may include a plurality of insulating layers 121, coils 122 to 125, and surface reforming layers 150.

The insulating layer 121 may contain a resin 121a and fillers 121b. The fillers 121b contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

Figure 6:
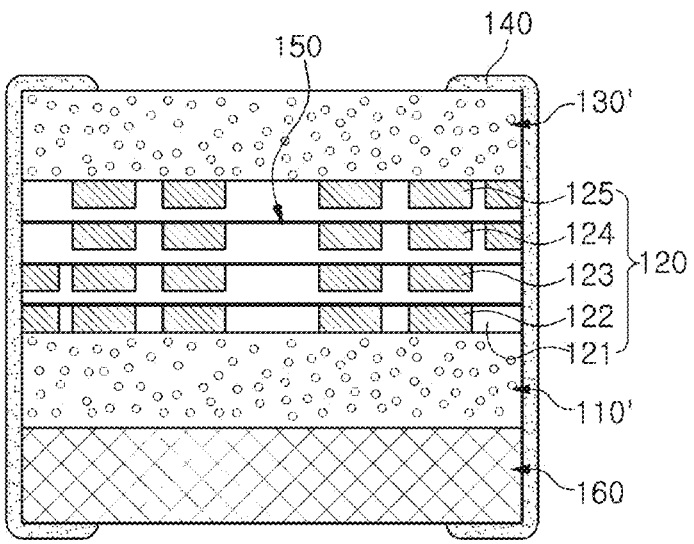

FIG. 6 is a schematic cross-sectional view of a common mode filter 104 according to a fourth exemplary embodiment.

In FIG. 6, the common mode filter 104 including an ESD preventing part 160 and including a first cover part 110' formed of a magnetic resin composite is illustrated.

The first cover part 110' may contain a magnetic resin composite unlike the first cover part according to the third exemplary embodiment including the ferrite substrate. Since the ferrite substrate used as the first cover part 110' is a ceramic sintered body, cracks may be generated in the ferrite substrate in a process of manufacturing or using the ferrite substrate. However, when the first cover part 110' is formed using the magnetic resin composite, flexibility may be provided to the first cover part 110', and thus generation of cracks may be reduced.

In addition, the common mode filter 104 may further include the ESD preventing part 160 disposed beneath the first cover part 110'.

The ESD preventing part 160 may include a thermistor disposed beneath the first cover part 110 formed of the ferrite substrate to allow the common mode filter 103 according to the present exemplary embodiment to serve as an ESD protecting element.

The coil part 120 may be disposed on the first cover part 110'.

The coil part 120 may include a plurality of insulating layers 121, coils 122 to 125, and surface reforming layers 150.

The insulating layer 121 may contain a resin 121a and fillers 121b. The fillers 121b contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

Figure 7:
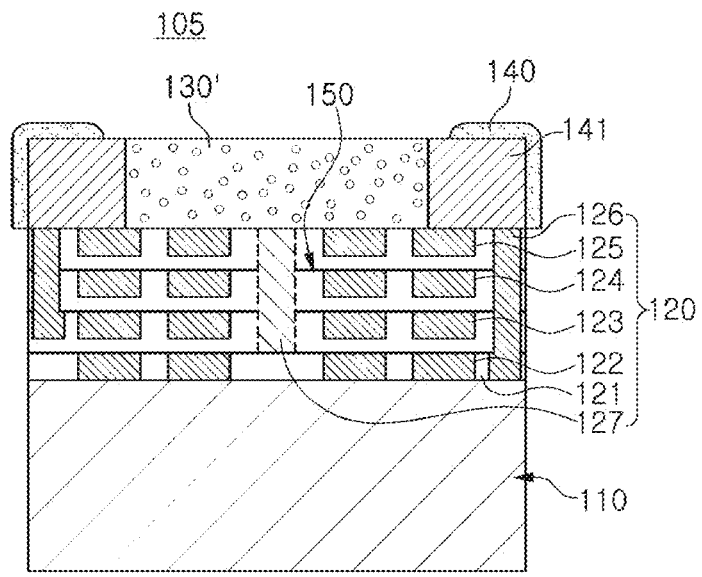

FIG. 7 is a schematic cross-sectional view of a common mode filter 105 according to a fifth exemplary embodiment.

Referring to FIG. 7, the common mode filter 105 according to the fifth exemplary embodiment may include a first cover part 110, a second cover part 130' and a coil part 120.

The coil part 120 may include a plurality of insulating layers 121, coils 122 to 125, and surface reforming layers 150.

The insulating layer 121 may contain a resin 121a and fillers 121b. The fillers 121b contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

In the common mode filter 105 according to the fifth exemplary embodiment, the coils 122 to 125 disposed in the coil part 120 may be electrically connected to connection electrodes 141 through connection vias 126 lengthily formed in a height direction. External electrodes 140 may be formed on surfaces of the connection electrodes 141.

In the common mode filter 105 according to the fifth exemplary embodiment, since the coils 122 to 125 are connected to the external electrodes 140 disposed on an upper surface of the common mode filter through the connection vias 126, separate external electrodes may not be formed on side surfaces of the common mode filter 105.

In addition, the common mode filter 105 according to the fifth exemplary embodiment may further include a core 127 disposed at the center of the coil part 120. The core 127 may improve performance of the common mode filter 105.

Figure 8:
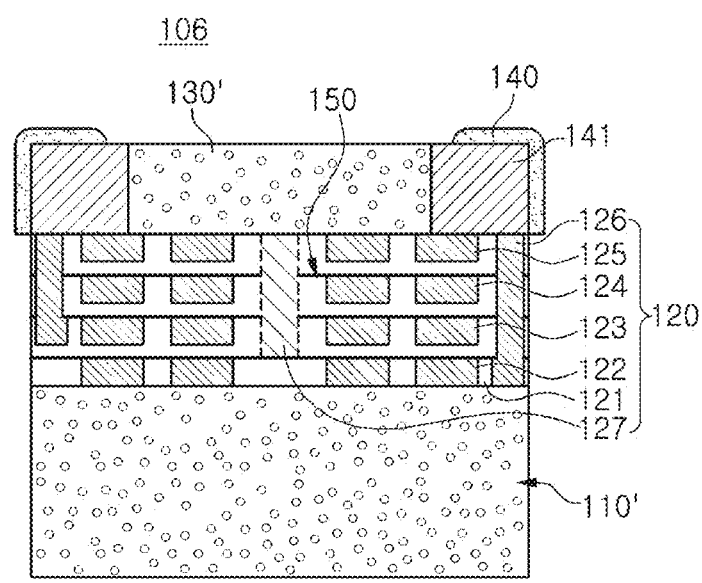

FIG. 8 is a schematic cross-sectional view of a common mode filter 106 according to a sixth exemplary embodiment.

Referring to FIG. 8, the common mode filter 106 according to the sixth exemplary embodiment may include a first cover part 110', a second cover part 130' and a coil part 120.

The coil part 120 may include a plurality of insulating layers 121, coils 122 to 125, and surface reforming layers 150.

The insulating layer 121 may contain a resin 121a and fillers 121b. The fillers 121b contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

The first cover part 110' may contain a magnetic resin composite unlike the first cover part according to the fifth exemplary embodiment including the ferrite substrate. Since the ferrite substrate used as the first cover part 110' is a ceramic sintered body, cracks may be generated in the ferrite substrate in a process of manufacturing or using the ferrite substrate. However, when the first cover part 110' is formed using the magnetic resin composite, flexibility may be provided to the first cover part 110', and thus generation of cracks may be reduced.

In the common mode filter 106 according to the sixth exemplary embodiment, the coils 122 to 125 disposed in the coil part 120 may be electrically connected to connection electrodes 141 through connection vias 126 lengthily formed in the height direction. External electrodes 140 may be formed on surfaces of the connection electrodes 141.

In the common mode filter 106 according to the sixth exemplary embodiment, since the coils 122 to 125 are connected to the external electrodes 140 disposed on an upper surface of the common mode filter through the connection vias 126, separate external electrodes may not be formed on side surfaces of the common mode filter 105.

In addition, the common mode filter 106 according to the sixth exemplary embodiment may further include a core 127 disposed at the center of the coil part 120. The core 127 may improve performance of the common mode filter 106.

Figure 9:
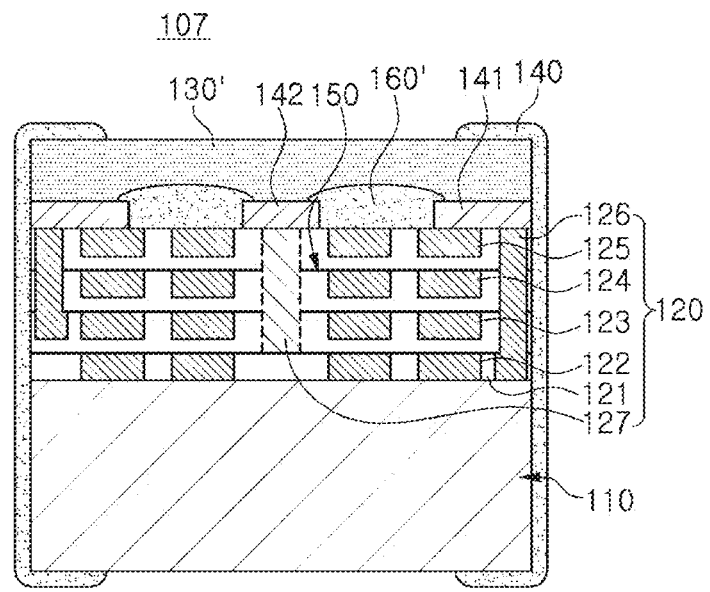
FIGS. 9 through 13 are schematic cross-sectional views of common mode filters according to other exemplary embodiments in the present disclosure.

FIG. 9 is a schematic cross-sectional view of a common mode filter 107 according to a seventh exemplary embodiment.

Referring to FIG. 9, the common mode filter 107 according to the seventh exemplary embodiment may include a first cover part 110' a coil part 120, and may further include an ESD preventing layer 160 and a ground electrode 142 disposed on the coil part 120.

The coil part 120 may include a plurality of insulating layers 121, coils 122 to 125, and surface reforming layers 150.

The insulating layer 121 may contain a resin 121*a* and fillers 121*b*. The fillers 121*b* contained in the insulating layers 121 may reduce adhesion between the respective insulating layers 121 in the process of bonding the respective insulating layers 121 to each other. However, since the surface reforming layers 150 contain a smaller amount of fillers than that of the insulating layers 121 or do not contain the fillers, the surface reforming layers 150 may be disposed between the insulating layers 121 to serve to improve adhesion between adjacent insulating layers 121.

In the common mode filter 107 according to the seventh exemplary embodiment, the coils 122 to 125 disposed in the coil part 120 may be electrically connected to connection electrodes 141 through connection vias 126 lengthily formed in the height direction. External electrodes 140 may be formed on surfaces of the connection electrodes 141.

In addition, the common mode filter 107 according to the seventh exemplary embodiment may further include a core 127 disposed at the center of the coil part 120. The core 127 may improve performance of the common mode filter 107.

The ground electrode 142 and the connection electrodes 141 may be formed on the coil part 120, that is, in a second cover part 130'. The ESD preventing layer 160 may be disposed between the connection electrodes 141 and the ground electrode 142. Although the ESD preventing layer has an insulating property at ordinary times by dispersing conductive particles in a polymer resin, when a high voltage such as static electricity is applied to the ESD preventing layer, electricity may flow in the ESD preventing layer to discharge a high voltage to the ground electrode 142, thereby protecting the common mode filter.

The connection electrodes 141 may be exposed to one side surface of the common mode filter 107 to thereby be electrically connected to the external electrodes 140. That is, the connection electrodes 141 may serve to electrically connect the coils 122 to 125 disposed in the coil part 120 and the external electrodes 140 to each other.

In addition, an external electrode (not illustrated) electrically connected to the ground electrode 142 may be disposed on the other side surface of the common mode filter 107.

FIGS. 10 through 13 are schematic cross-sectional views of common mode filters according to other exemplary embodiments.

Common mode filters according to other exemplary embodiments will be described with reference to FIGS. 10 through 13.

Figure 10:
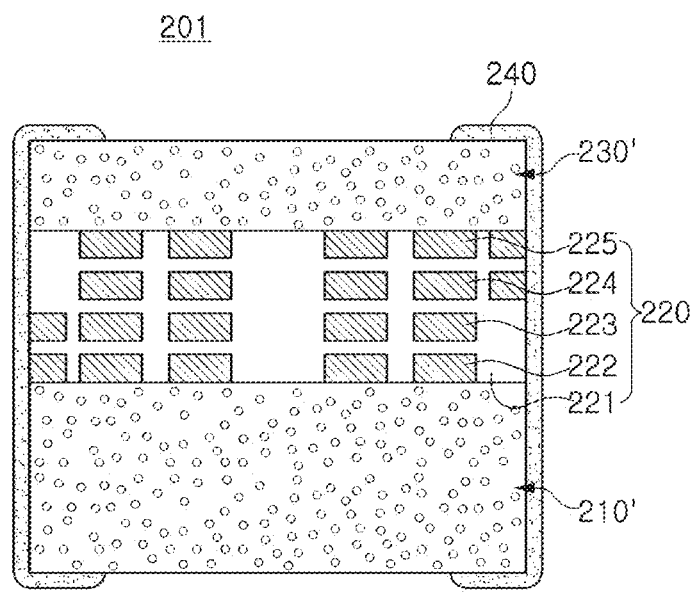

FIG. 10 is a schematic cross-sectional view of a common mode filter 201 according to an eighth exemplary embodiment.

Referring to FIG. 10, the common mode filter 201 according to the eighth exemplary embodiment may include a first cover part 210', a second cover part 230' and a coil part 220.

The first cover part 210' and the second cover part 230' may contain a magnetic resin composite. In a case in which a ferrite substrate is used as the cover part, since the ferrite substrate is a ceramic sintered body, cracks may be generated in the ferrite substrate in a process of manufacturing or using the ferrite substrate. However, when the first and second cover parts 210' and 230' are formed using the magnetic resin composite, flexibility may be provided to the first and second cover parts 210' and 230', and thus generation of cracks may be reduced.

The coil part 220 may be disposed on the first cover part 210.

The coil part 220 may include a plurality of insulating layers 221 and coils 222 to 225.

The coils 222 to 225 may be disposed in a spiral shape, and may be formed of a conductive material. For example, the coils 222 to 225 may be formed on the insulating layers 221 by a screen printing or lithography process.

One end portions of first to fourth coils 222 to 225 may be exposed to a side surface of the coil part 220 to thereby be electrically connected to an external electrode 240 to be described below.

The first and third coils 222 and 224 may be electrically connected to each other by conductive vias (not illustrated) of the insulating layers 221, and the second and fourth coils 223 and 225 may also be electrically connected to each other by conductive vias (not illustrated) of the insulating layers 221.

The conductive vias may be formed by forming via holes in the insulating layers 221 by a laser punching or mechanical punching method and filling the via holes with a conductive material.

The insulating layers 221 may be configured in a stack form using build-up films of ABF, polyimide, epoxy, BCB, or the like. The build-up films may contain fillers in order to enhance a physical feature or a magnetic feature of the build-up film.

Figure 11:
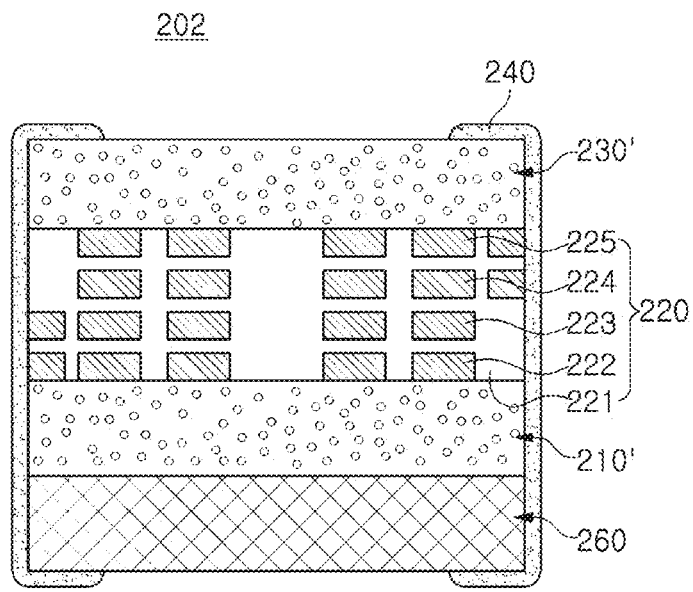

FIG. 11 is a schematic cross-sectional view of a common mode filter 202 according to a ninth exemplary embodiment.

Referring to FIG. 11, the common mode filter 202 according to the ninth exemplary embodiment may include a first cover part 210', a second cover part 230' and a coil part 220.

The first cover part 210' and the second cover part 230' may contain a magnetic resin composite. In a case in which a ferrite substrate is used as the cover part, since the ferrite substrate is a ceramic sintered body, cracks may be generated in the ferrite substrate in a process of manufacturing or using the ferrite substrate. However, when the first and second cover parts 210' and 230' are formed using the magnetic resin composite, flexibility may be provided to the first and second cover parts 210' and 230', and thus generation of cracks may be reduced.

The common mode filter 202 according to the ninth exemplary embodiment may further include an ESD preventing part 260 disposed beneath the first cover part 210, as compared with the common mode filter 201 according to the eighth exemplary embodiment.

The ESD preventing part 260 may include a thermistor disposed beneath the first cover part 210 formed of the ferrite substrate to allow the common mode filter 203 according to the present exemplary embodiment to serve as an ESD protecting element.

The ESD preventing part 260 may be formed by forming two ESD electrodes (not illustrated) to be spaced apart from each other and providing an ESD material in a space between the ESD electrodes spaced apart from each other. As the ESD material, a material obtained by dispersing conductive metals such as Cu, Ag, or the like, in an insulating inorganic material such as $Al_2O_3$, $TiO_2$, Zn, or the like, or an insulating organic material may be used. In addition, materials that are operated as a non-conductor at ordinary times and conduct electricity through conductive metals when an over-voltage such as static electricity is applied thereto may be used as the ESD material.

The common mode filter 203 according to the present exemplary embodiment may further include external electrodes (not illustrated) electrically connected to the ESD electrodes in the ESD preventing part 160.

Figure 12:
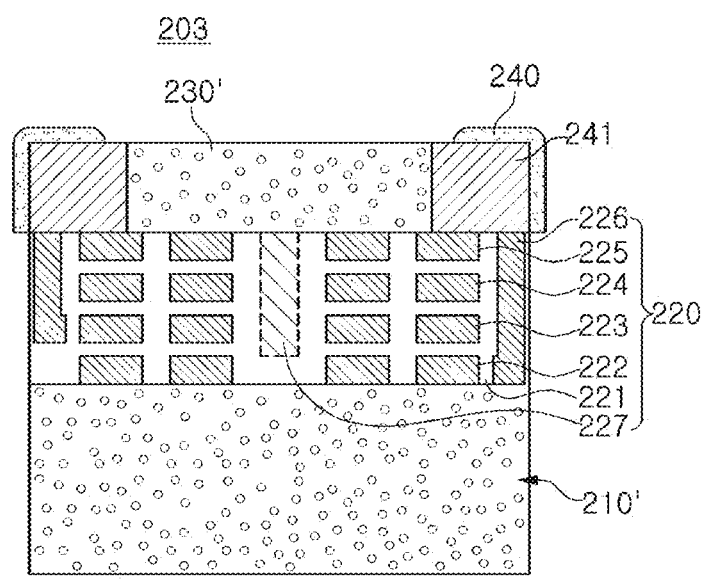

FIG. 12 is a schematic cross-sectional view of a common mode filter 203 according to a tenth exemplary embodiment.

Referring to FIG. 12, the common mode filter 203 according to the tenth exemplary embodiment may include a first cover part 210', a second cover part 230' and a coil part 220.

The first cover part 210' and the second cover part 230' may contain a magnetic resin composite. In a case in which a ferrite substrate is used as the cover part, since the ferrite substrate is a ceramic sintered body, cracks may be generated in the ferrite substrate in a process of manufacturing or using the ferrite substrate. However, when the first and second cover parts 210' and 230' are formed using the magnetic resin composite, flexibility may be provided to the first and second cover parts 210' and 230', and thus generation of cracks may be reduced.

In the common mode filter 203 according to the tenth exemplary embodiment, the coils 222 to 225 disposed in the coil part 220 may be electrically connected to connection electrodes 241 through connection vias 226 lengthily formed in the height direction. External electrodes 241 may be formed on surfaces of the connection electrodes 240.

In the common mode filter 203 according to the tenth exemplary embodiment, since the coils 222 to 225 are connected to the external electrodes 240 disposed on an upper surface of the common mode filter through the connection vias 226, separate external electrodes may not be formed on side surfaces of the common mode filter 203.

In addition, the common mode filter 203 according to the tenth exemplary embodiment may further include a core 227 disposed at the center of the coil part 220. The core 227 may improve performance of the common mode filter 203.

Figure 13:
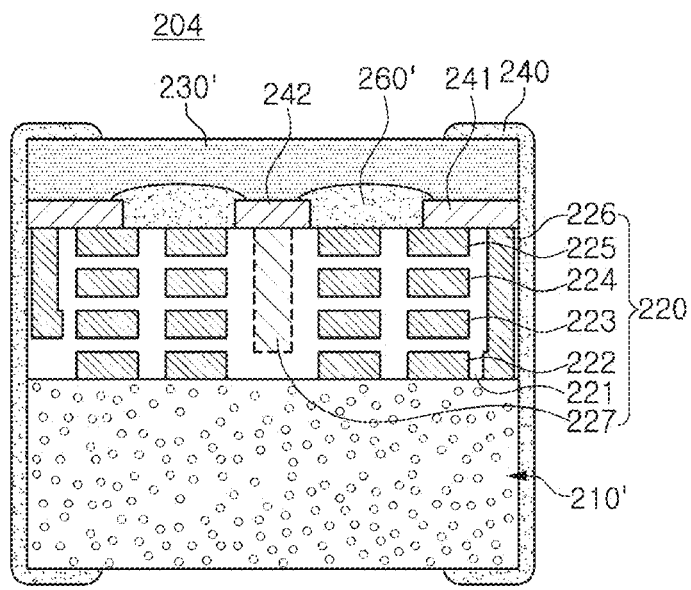

FIG. 13 is a schematic cross-sectional view of a common mode filter 204 according to an eleventh exemplary embodiment.

Referring to FIG. 13, the common mode filter 204 according to the eleventh exemplary embodiment may include a first cover part 210', a second cover part 230' and a coil part 220.

The first cover part 210' and the second cover part 230' may contain a magnetic resin composite. In a case in which a ferrite substrate is used as the cover part, since the ferrite substrate is a ceramic sintered body, cracks may be generated in the ferrite substrate in a process of manufacturing or using the ferrite substrate. However, when the first and second cover parts 210' and 230' are formed using the magnetic resin composite, flexibility may be provided to the first and second cover parts 210' and 230', and thus generation of cracks may be reduced.

The common mode filter 203 according to the eleventh exemplary embodiment may further include an ESD preventing layer 260' and a ground electrode 242 disposed on the coil part 220, as compared to the common mode filter 203 according to the tenth exemplary embodiment.

The ground electrode 242 and the connection electrodes 241 may be formed on the coil part 220, that is, in a second cover part 230'. The ESD preventing layer 260 may be disposed between the connection electrodes 241 and the ground electrode 242. Although the ESD preventing layer has an insulating property at ordinary times by dispersing conductive particles in a polymer resin, when a high voltage such as static electricity is applied to the ESD preventing layer, electricity may flow in the ESD preventing layer to discharge a high voltage to the ground electrode 242, thereby protecting the common mode filter.

The connection electrodes 241 may be exposed to one side surface of the common mode filter 204 to thereby be electrically connected to the external electrodes 240. That is, the connection electrodes 241 may serve to electrically connect the coils 222 to 225 disposed in the coil part 220 and the external electrodes 240 to each other.

In addition, an external electrode (not illustrated) electrically connected to the ground electrode 242 may be disposed on the other side surface of the common mode filter 204.

FIGS. 14 through 24 are schematic cross-sectional views of respective processes of a method of manufacturing a common mode filter according to an exemplary embodiment.

A method of manufacturing a common mode filter according to an exemplary embodiment will be described with reference to FIGS. 14 through 24.

Figure 14:
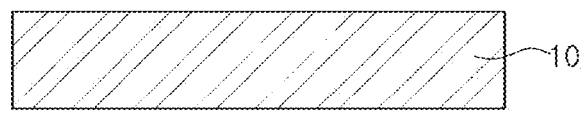
FIGS. 14 through 24 are schematic cross-sectional views of respective operations of a method of manufacturing a common mode filter according to an exemplary embodiment in the present disclosure.

First, a detachable core 10 may be prepared (see FIG. 14).

The detachable core 10 may be positioned at a central portion until a core part and a cover part are formed.

Figure 15:
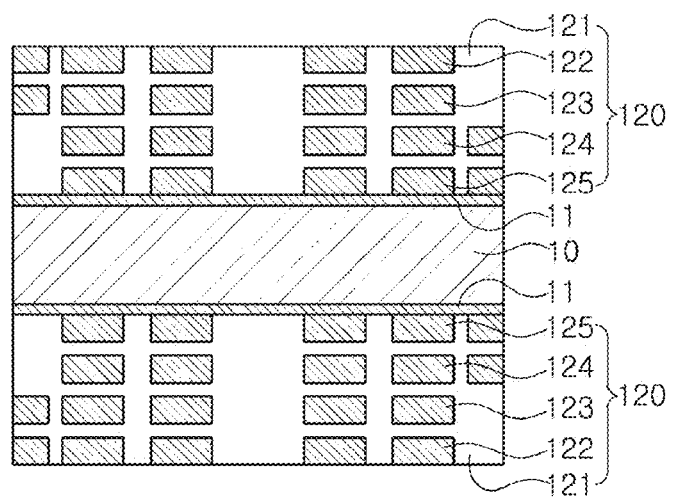

Then, adhesion metal layers 11 may be formed on both surfaces of the detachable core 10, and coils 125 may be formed on one surfaces of the adhesion metal layers 11 (see FIG. 15). A process of forming an insulating layer 121 on the coil 125 and again forming a new coil 125 on the insulating layer 121 may be repeated to form the coil part 120 (see FIG. 15).

The adhesion metal layer 11 may be formed of the same metal, for example, copper (Cu), as that of the coil.

The insulating layers 121 may be configured in a stack form using build-up films of ABF, polyimide, epoxy, BCB, or the like. The build-up films may contain fillers in order to enhance a physical feature or a magnetic feature of the build-up film.

In order to form the coil part 120 as described above, a process of forming the coils 122 to 125 on each of the plurality of insulating layers 121 and then stacking and compressing the plurality of insulating layers 121 on which the coils 122 to 125 are formed may be performed. However, the fillers contained in the insulating layers 121 may cause a reduction in adhesion between the respective insulating layers 121 in a process of bonding the respective insulating layers 121 to each other.

Figure 16:
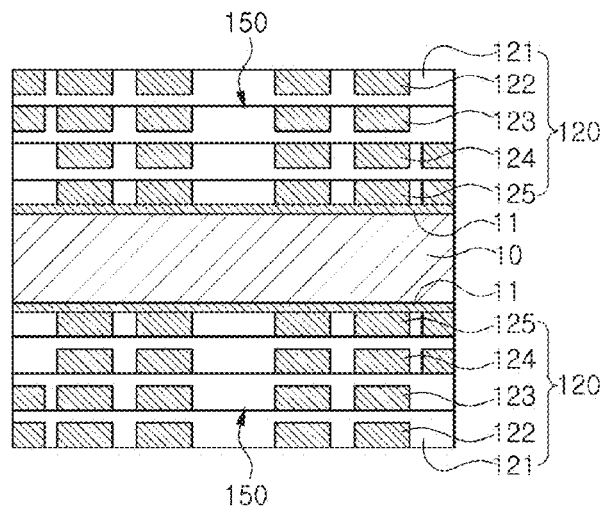

Therefore, as illustrated in FIG. 16, the surface reforming layers 150 may be formed between the respective insulating layers 121.

A method of forming the surface reforming layer 150 will be described with reference to FIGS. 17 through 19.

Figure 17:
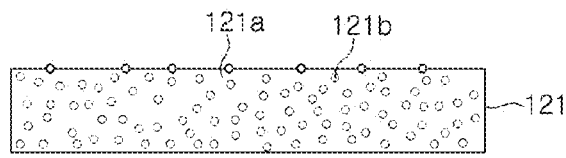

As illustrated in FIG. 17, the insulating layer 121 may be formed by dispersing the fillers 121b in the polymer resin 121a.

Figure 18:
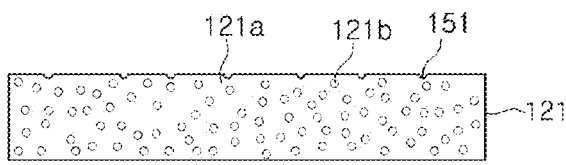
Figure 19:
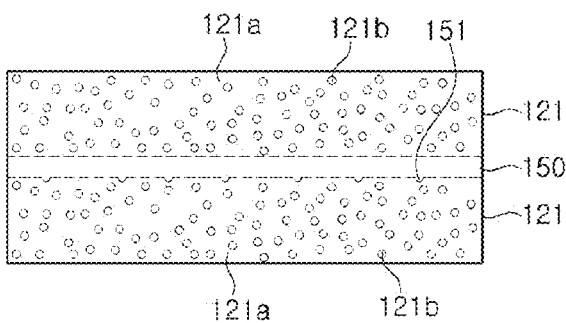

Then, as illustrated in FIG. 18, chemical surface treatment (for example, a desmear process) may be performed on one surface of the insulating layer 121 to remove fillers 121b exposed to a surface of the insulating layer 121.

When a new insulating layer 121 is stacked and compressed (see FIG. 19) after the fillers 121b exposed to the surface are removed, the surface reforming layer 150 may be formed between the insulating layers 121.

When the fillers 121b are removed as described above, the surface reforming layer 150 may not contain the fillers or may contain at least a smaller amount of fillers than that of the insulating layer 121.

In addition, portions in which the fillers are removed in the surface reforming layer 150 may have a groove shape. The portions in which the fillers are removed as described above may serve as anchors 151.

Therefore, some of the materials configuring the insulating layers 121 may be accommodated in the anchors 151 in a process of stacking and compressing the insulating layers 121, and thus adhesion between the insulating layers 121 may be further improved.

In addition, the fillers may be removed in a surface treatment process, and thus average roughness Ra of the surface reforming layer 150 may be improved.

The surface reforming layer 150 may be formed at a thickness of 1 μm or more for the purpose of a substantial effect of improvement of the adhesion, and more preferably, at a thickness of 1.5 μm to 0.3 μm. In a case in which a thickness of the surface reforming layer 150 exceeds 3.0 μm, a region in which a content of fillers is low or the fillers are not contained in the coil part 120 may be increased, and thus performance of the common mode filter may be deteriorated, and in a case in which a thickness of the surface reforming layer 150 is less than 1.5 μm, an adhesion improving effect between the insulating layers 121 may be low.

Figure 20:
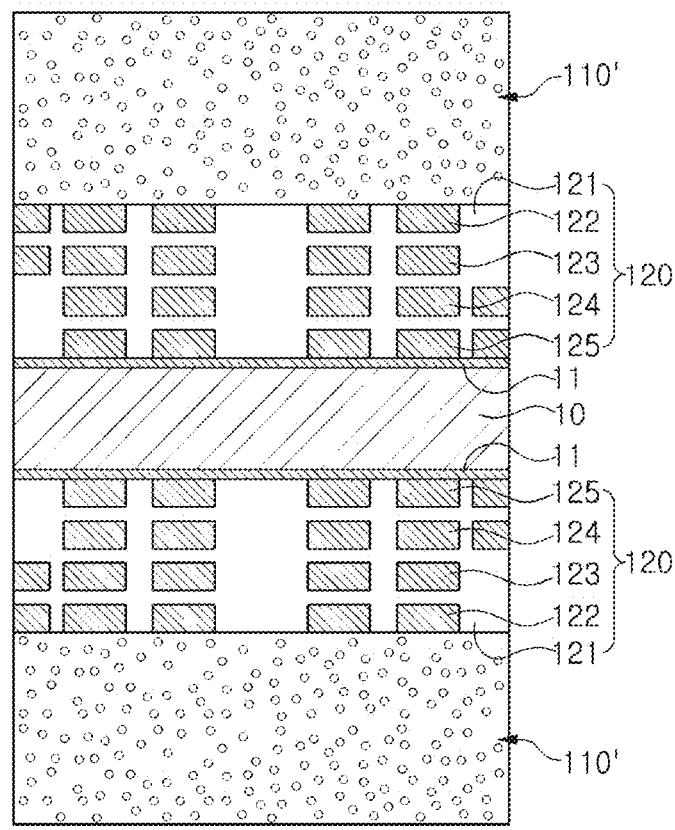

After the coil part 120 is formed as described above, the first cover part 110' may be formed on one surface of the coil part 120 (see FIG. 20).

The first cover part 110' may be formed of the magnetic resin composite formed by dispersing the magnetic particles in the polymer resin.

Figure 21:
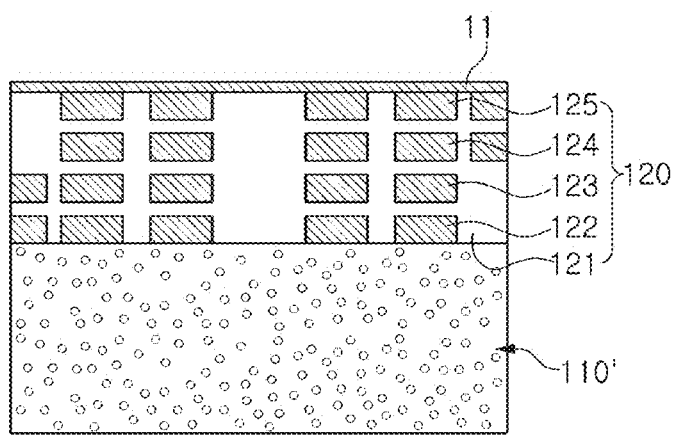

Then, as illustrated in FIG. 21, the adhesion metal layers 11 attached to both surfaces of the detachable core 10 may be separated from the detachable core 10.

The adhesion metal layer 11 may be exposed on one surface of the coil part 120 and the first cover part 110' separated together with the adhesion metal layer 11.

Figure 22:
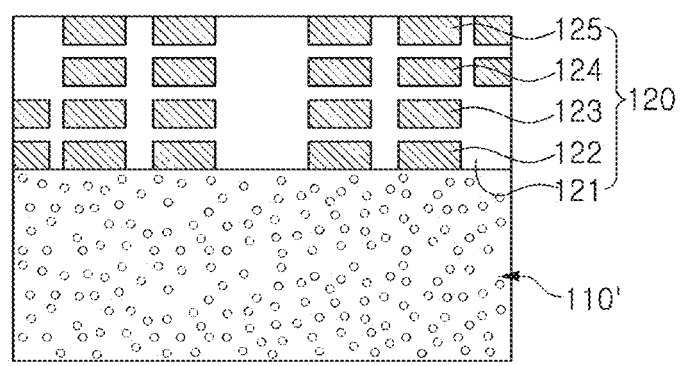

The exposed adhesion metal layer 11 may be removed through etching (see FIG. 22).

Figure 23:
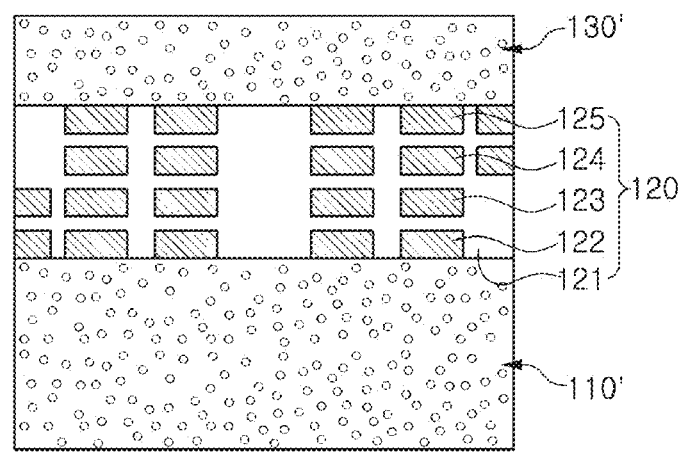
Figure 24:
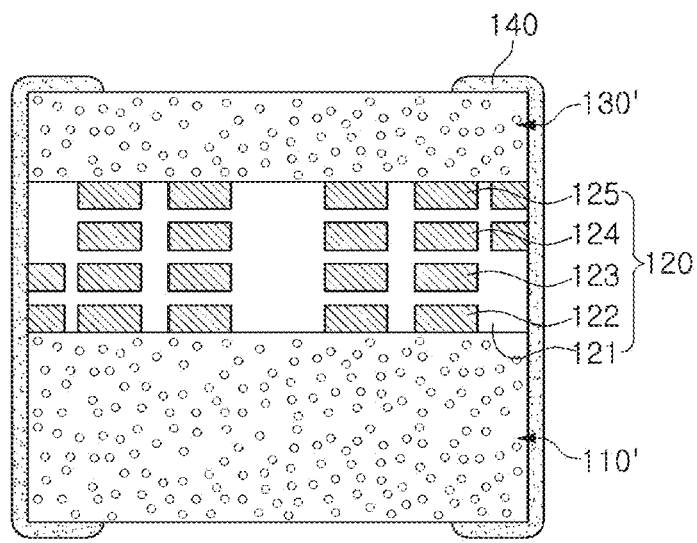

The adhesion metal layer 11 may be removed, and the second cover part 130' may be formed on the coil part 120 from which the adhesion metal layer 11 is removed (see FIG. 23).

The second cover part 130' may be formed of the magnetic resin composite formed by dispersing the magnetic particles in the polymer resin.

If necessary, a side surface of the coil part 120 may be polished to expose one end portions of the coils 122 to 125, and the external electrodes 140 may be formed on side surfaces of the common mode filter (see FIG. 24) to complete the common mode filter.

FIGS. 25 through 30 are schematic cross-sectional views of respective processes of a method of manufacturing a common mode filter according to another exemplary embodiment. A method of manufacturing a common mode filter according to another exemplary embodiment will be described with reference to FIGS. 25 through 30.

First, as in FIG. 14, a detachable core 10 may be prepared.

Figure 25:
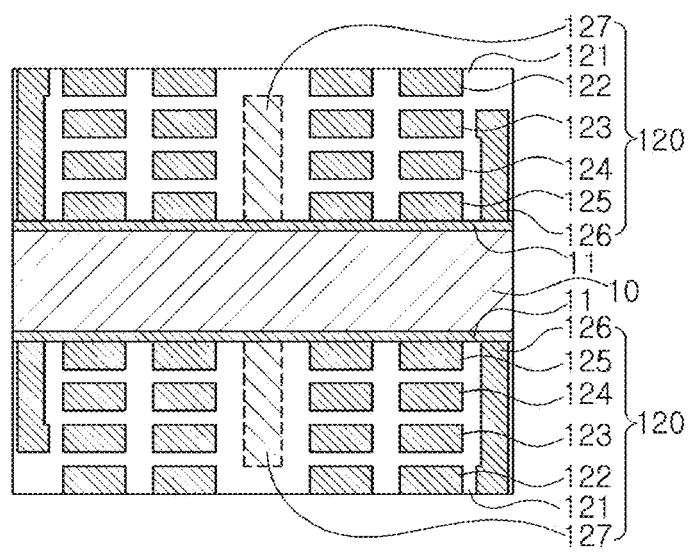
FIGS. 25 through 30 are schematic cross-sectional views of respective operations of a method of manufacturing a common mode filter according to another exemplary embodiment in the present disclosure.

Then, adhesion metal layers 11 may be formed on both surfaces of the detachable core 10, and coils 125 may be formed on one surfaces of the adhesion metal layers 11 (see FIG. 25). A process of forming an insulating layer 121 on the coil 125 and again forming a new coil 125 on the insulating layer 121 may be repeated to form the coil part 120 (see FIG. 25).

Here, the connection vias 126 and the core 127 may also be formed together with the coils 125.

Although not illustrated, a process of forming the insulating layer 121 may include a process of forming the surface reforming layer.

Figure 26:
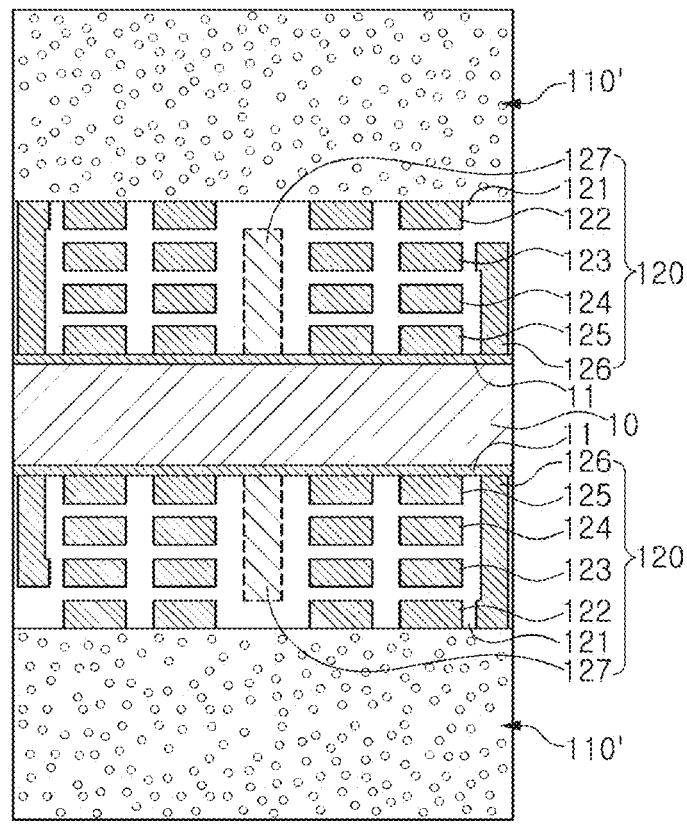

After the coil part 120 is formed as described above, the first cover part 110' may be formed on one surface of the coil part 120 (see FIG. 26).

The first cover part 110' may be formed of the magnetic resin composite formed by dispersing the magnetic particles in the polymer resin.

Figure 27:
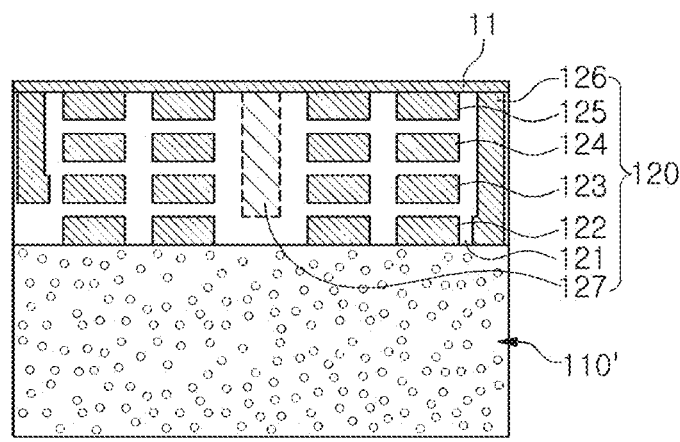

Then, as illustrated in FIG. 27, the adhesion metal layers 11 attached to both surfaces of the detachable core 10 may be separated from the detachable core 10.

The adhesion metal layer 11 may be exposed on one surface of the separated coil part 120 and the first cover part 110'.

Figure 28:
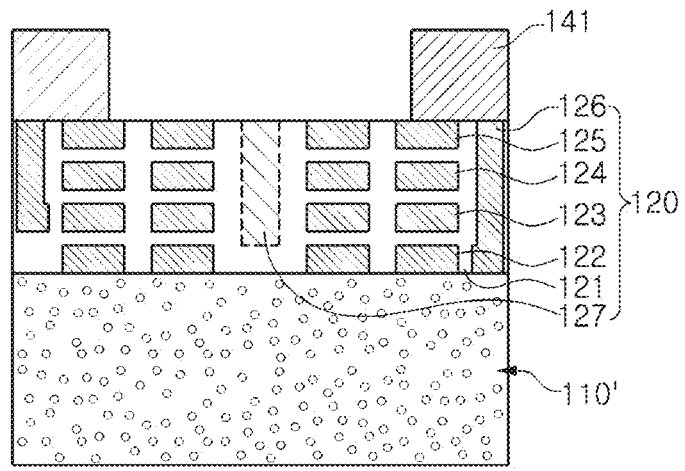

The exposed adhesion metal layer 11 may be removed through etching, and the connection pads 141 electrically connected to the connection vias 126 may be formed on an upper surface of the coil part 120 (see FIG. 28).

Figure 29:
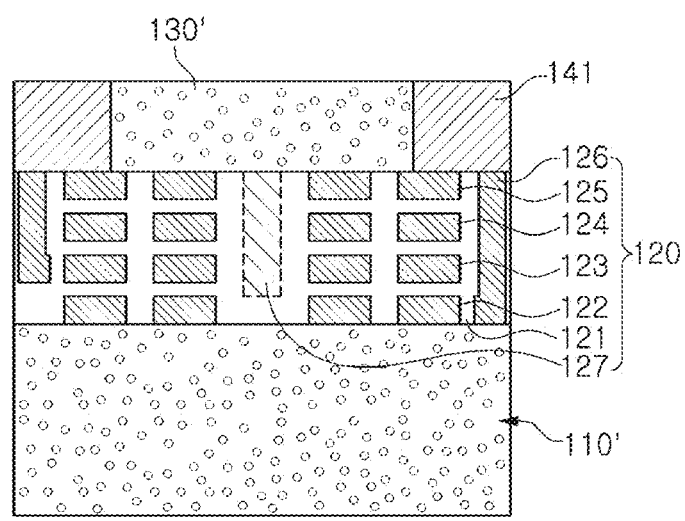

Then, the second cover part 130' may be formed on the upper surface of the coil part 120 (see FIG. 29).

The second cover part 130' may be formed of the magnetic resin composite formed by dispersing the magnetic particles in the polymer resin.

Figure 30:
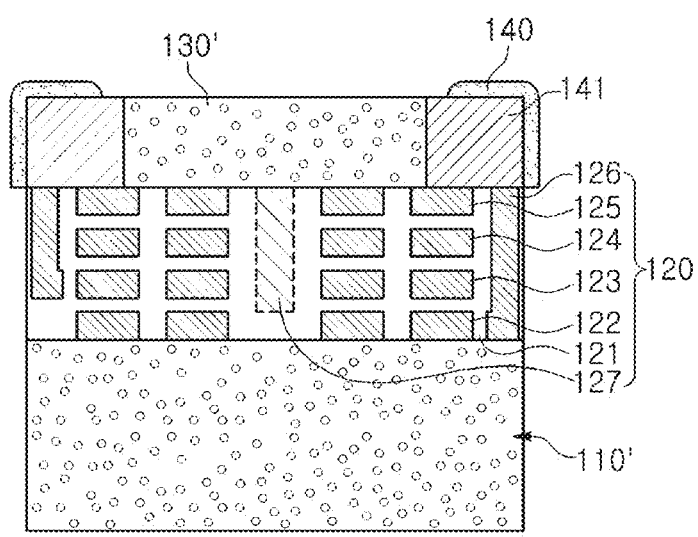

Finally, the external terminals 140 may be formed on the surfaces of the connection terminals 141 (see FIG. 30).

The common mode filter according to the present exemplary embodiment may perform both an ESD protecting function and a function of the common mode filter, and thus miniaturization of an electronic product may be accomplished, and a double-sided stack scheme using the detachable core may be used, and thus a process may be simplified and a manufacturing cost of the common mode filter may be reduced.

As set forth above, in the common mode filters according to exemplary embodiments, the surface reforming layers may be formed between insulating layers, thereby improving adhesion between the respective coil layers.

In addition, according to exemplary embodiments, a ferrite resin layer instead of the ferrite substrate according to the related art is used as a lower magnetic layer, and thus the common mode filter may be easily handled even in a case in which a thickness of the common mode filter is reduced. Therefore, defects such as cracks may be prevented, and thus yield may be increased.

Protection of the common mode filter from static electricity, which is another object of the present disclosure, may be accomplished by providing the common mode filter further including the ESD protecting layer.

While exemplary embodiments have been shown and described above, it will be apparent to those skilled in the art that modifications and variations could be made without departing from the scope of the present invention as defined by the appended claims.

What is claimed is:

1. A common mode filter comprising:
   a coil part in which a plurality of insulating layers containing fillers and having coils formed on respective surfaces thereof are stacked;
   a first cover part disposed beneath the coil part; and
   a second cover part disposed on the coil part,
   wherein surface reforming layers improving close adhesion between the plurality of insulating layers are formed on at least one of the surfaces of the plurality of insulating layers,
   wherein a plurality of anchors accommodating resins of adjacent plurality of insulating layers therein in a process of bonding the adjacent plurality of insulating layers to each other to improve adhesion therebetween are disposed on one surface of each one of the surface reforming layers.

2. The common mode filter of claim 1, wherein the each one of the surface reforming layers contains a smaller amount of fillers than that of each one of the plurality of insulating layers or does not contain the fillers.

3. The common mode filter of claim 1, wherein the second cover part includes:
   a ground electrode disposed on the coil part;
   a plurality of connection electrodes disposed on the coil part and electrically connected to the coils; and
   an ESD preventing layer disposed between the plurality of connection electrodes and the ground electrode.

4. The common mode filter of claim 1, wherein each one of the surface reforming layers has a thickness of 1.5 μm to 3.0 μm.

5. The common mode filter of claim 1, wherein the first and second cover parts contain a magnetic resin composite containing magnetic particles.

6. The common mode filter of claim 5, wherein the magnetic resin composite has a magnetic permeability of 20 or more.

7. The common mode filter of claim 1, further comprising an electrostatic discharge (ESD) preventing part disposed beneath the second cover part,
   wherein the ESD preventing part includes first and second ESD electrodes spaced apart from each other and an ESD preventing layer formed between the first and second ESD electrodes.

8. A common mode filter comprising:
   a coil part in which a plurality of insulating layers containing fillers and having coils formed on respective surfaces thereof are stacked;
   surface reforming layers formed on at least one of the surfaces of the plurality of insulating layers;
   a first cover part disposed beneath the coil part; and
   a second cover part disposed on the coil part,
   wherein the first and second cover parts contain a magnetic resin composite containing magnetic particles, and
   wherein a plurality of anchors accommodating resins of adjacent plurality of insulating layers therein in a process of bonding the adjacent plurality of insulating layers to each other to improve adhesion therebetween are disposed on one surface of each one of the surface reforming layers.

9. The common mode filter of claim 8, wherein the magnetic resin composite has a magnetic permeability of 20 or more.

* * * * *